United States Patent
Yeh et al.

(10) Patent No.: US 8,366,505 B2
(45) Date of Patent: Feb. 5, 2013

(54) APPARATUS OF ORGANIC LIGHT EMITTING DIODE AND PACKAGING METHOD OF THE SAME

(75) Inventors: Shu-Tang Yeh, Taichung County (TW); Jing-Yi Yan, Taoyuan County (TW); Kung-Yu Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 565 days.

(21) Appl. No.: 12/487,660

(22) Filed: Jun. 19, 2009

(65) Prior Publication Data

US 2010/0164369 A1   Jul. 1, 2010

(30) Foreign Application Priority Data

Dec. 30, 2008   (TW) ............................... 97151409 A

(51) Int. Cl.
*H01J 9/26*   (2006.01)
(52) U.S. Cl. ......................... 445/25; 313/512
(58) Field of Classification Search ................ 313/512; 445/25
See application file for complete search history.

(56) References Cited

U.S. PATENT DOCUMENTS

| | | | |
|---|---|---|---|
| 6,933,538 B2 | 8/2005 | Hunze et al. | |
| 7,121,912 B2 | 10/2006 | Ghosh | |
| 7,329,986 B2 | 2/2008 | Stegamat | |
| 7,365,442 B2 | 4/2008 | Pichler | |
| 2003/0017297 A1* | 1/2003 | Song et al. | 428/68 |
| 2004/0242116 A1* | 12/2004 | Forrest et al. | 445/25 |
| 2005/0046342 A1* | 3/2005 | Park et al. | 313/504 |
| 2005/0116638 A1* | 6/2005 | Chung et al. | 313/512 |
| 2005/0248270 A1* | 11/2005 | Ghosh et al. | 313/512 |
| 2006/0158111 A1* | 7/2006 | Hayashi | 313/512 |
| 2007/0172971 A1 | 7/2007 | Boroson | |

* cited by examiner

*Primary Examiner* — Anh Mai
*Assistant Examiner* — Andrew Coughlin
(74) *Attorney, Agent, or Firm* — Jianq Chyun IP Office

(57) ABSTRACT

A packaging method of an organic light emitting diode (OLED) is described. First, a substrate is provided, and the substrate has the OLED device formed thereon. Thereafter, at least one protection layer is formed on the substrate, so as to cover the peripheral sidewall of the OLED device entirely. The step of forming the protection layer includes forming an organic layer on the substrate, and then forming a metal layer on the organic layer, wherein the metal layer at least covers a sidewall of the OLED device. Afterwards, an oxidation treatment is performed, so as to oxidize a portion of the metal layer.

45 Claims, 10 Drawing Sheets

APPARATUS OF ORGANIC LIGHT EMITTING DIODE AND PACKAGING METHOD OF THE SAME

CROSS-REFERENCE TO RELATED APPLICATION

This application claims the priority benefit of Taiwan application serial no. 97151409, filed Dec. 30, 2008. The entirety of the above-mentioned patent application is hereby incorporated by reference herein and made a part of specification.

BACKGROUND OF THE INVENTION

1. Field of Invention

The present invention relates to an apparatus of an organic light emitting diode (OLED) which provides good resistance to water vapor and oxygen and a packaging method of forming the apparatus.

2. Description of Related Art

Recently, a flat panel display has been the focus display as the technology is advanced. In particular, an organic electro-luminescence display has the advantages of self-luminescence, no viewing angle restriction, low power consumption, simple manufacturing process, low production cost, low operation temperature, fast responsive speed and full-colors. Accordingly, the organic electro-luminescence display has great potential for applications and becomes the mainstream for the next generation displays. The organic electro-luminescent display utilizes a self-luminescence feature of the organic functional material in the OLED device for providing display purposes. The OLED device is typically comprised of a pair of electrodes and the organic functional layer. As the current passes through the area between the anode and the cathode, the electrons and the holes in the organic functional layer are combined to produce excitons, thus allowing the organic functional layer, according to its material characteristics, to produce different light emitting mechanisms for different colors.

The organic functional material and the anode of the OLED device react with water vapor and oxygen in the air easily, and thus the performance of the device is degraded. Therefore, it is fairly important to remove water vapor thoroughly so as to enhance the durability of the organic light emitting panel. During the manufacturing process of the OLED, a deposition process is usually performed under vacuum, and the OLED is sealed with a packaging method. The manufacturing process of the OLED device is in a high-vacuum environment. However, it is required to change the environment from high vacuum to low water vapor and oxygen state when the top cover packaging process is performed. The transition state allows few water vapor and oxygen to adhere to the OLED and the lifetime of the device is accordingly reduced.

Getter is applied to the packaging technology using a hard substrate (such as a glass) for reducing the effect of water vapor and oxygen on the device. However, no space for the getter is present in the flexible OLED device structure, and such method cannot assure that the OLED is not affected by water vapor and oxygen. Therefore, another packaging technology using a film is developed to replace the packaging technology using the getter.

Generally speaking, the film packaging process without using the getter is require to directly perform after the anode of the OLED is deposited by evaporation. Accordingly, the process is limited to be conducted at low temperature and with low electric power, and thus a conventional chemical vapor deposition process or a sputtering process cannot be applied to the film packaging.

The U.S. Pat. No. 7,121,912 proposed a treatment method of the anode of a OLED, in which the fabricated OLED device is put in the ozone environment and heated to the temperature less than 100° C. for 30 minutes when the packaging process is performed.

As described above, the packaging technology has a great effect on the lifetime and the performance of the OLED device. Therefore, how to use the film packaging to isolate the OLED from the external environment so as to increase the lifetime of the device has been one of the main topics in the industry.

SUMMARY OF THE INVENTION

Accordingly, the present invention provides a packaging method of an OLED, in which a simple film packaging technology is applied to protect the OLED device, and thus the lifetime of the device is increased.

The present invention further provides an OLED apparatus to reduce the effect of water vapor and oxygen on the OLED device.

The present invention provides a packaging method of an OLED. First, a substrate is provided, and the substrate has the OLED device formed thereon. Thereafter, at least one protection layer is formed on the substrate, so as to cover the peripheral sidewall of the OLED device entirely. The step of forming the protection layer includes forming an organic layer on the substrate, and then forming a metal layer on the organic layer, wherein the metal layer at least covers a sidewall of the OLED device. Afterwards, an oxidation treatment is performed, so as to oxidize a portion of the metal layer.

The present invention further provides an OLED apparatus including a substrate, an OLED device and at least one protection layer. The OLED device is disposed on the substrate. The protection layer is disposed on the substrate and covers the peripheral sidewall of the OLED device entirely. The protection layer includes an organic layer, a metal layer and a metal oxide layer. The organic layer is disposed on the substrate. The metal layer is disposed on the organic layer, and the metal layer at least covers a sidewall of the OLED device. The metal oxide layer is disposed on the surface of the metal layer.

In summary, the packaging method of the OLED of the present invention includes sequentially stacking an organic layer and a metal layer on the OLED device, and then performing an oxidation treatment to form a dense metal oxide layer on the surface of the metal layer, so as to enhance the capability of the film packaging. The packaging method in accordance with the present invention can effectively isolate the OLED device from the external environment with a simple method and provide better side leakage proof and thus longer lifetime of the device.

In addition, the OLED apparatus of the present invention has a stacked structure including an organic material and an inorganic material as a protection layer of the OLED device. Moreover, the side sealing of the device is enhanced by the stacked inorganic structure on the sidewall of the OLED device. Therefore, the effect of water vapor and water on the OLED device is greatly reduced and the lifetime of the device is increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following detailed description of the embodiments, reference is made to the accompanying drawings for illustrating the specific embodiments of the present invention. In this regard, directional terminology, such as "on", "below", "front", "back", "left", "right", "in", "out" or etc., is used with reference to the orientation of the Figure(s) being described. As such, the directional terminology is only used for illustration purposes and is not construed as limiting the present invention.

FIGS. 1A to 1F schematically illustrate, in a cross-sectional view, a package flow of an organic OLED according to a first embodiment of the present invention.

Figure 1A:
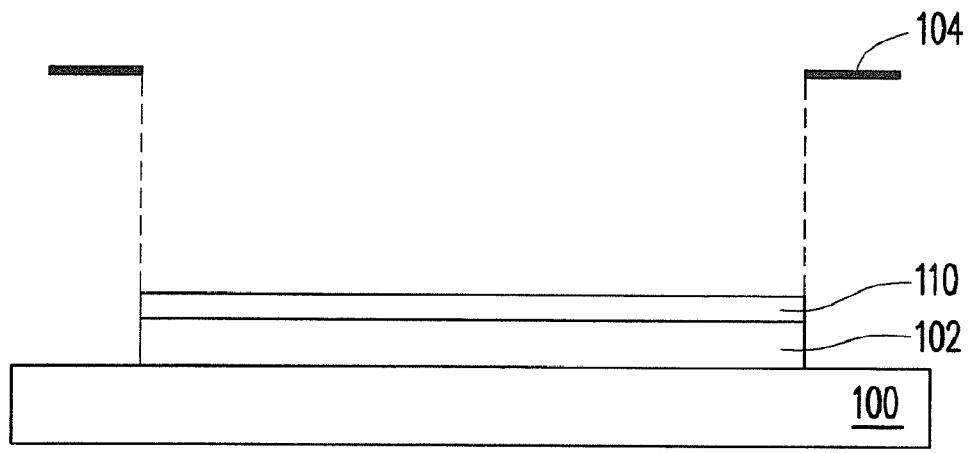
FIGS. 1A to 1F schematically illustrate, in a cross-sectional view, a package flow of an organic OLED according to a first embodiment of the present invention.

Referring to FIG. 1A, a substrate 100 is provided. The substrate 100 has an OLED device 102 formed thereon. The substrate 100 may be a flexible substrate or a hard substrate. The flexible substrate is a plastic substrate, and the material thereof includes polyethersulfone (PES), polyethylene terephthalate (PET) or polyimide (PI), for example. The hard substrate is a glass substrate, for example. It is noted that the package flow (as described below) of the OLED of the present invention is provided for illustration purposes, and thereby enables those of ordinary skill in the art to practice this invention, but is not intended to limit the scope of this invention. The OLED device 102 can be fabricated with the known technology, and the layer arrangements and forming methods thereof are well-known to those of ordinary skill in the art, and thus the detailed are not iterated.

Referring to FIG. 1A, an organic layer 110 is formed on the substrate 100 by using a shadow mask 104 as a mask. In an embodiment, the organic layer 110 is formed on the OLED device 102 corresponding to the OLED device 102. That is, the shadow mask 104 is aligned with the central region of the OLED device 102. The shadow mask 104 is a fully-open metal shadow mask, and the exposed area of the shadow mask 104 is substantially the same as the area of anode (not shown) of the OLED device 102. The organic layer 110 includes an organic material with better resistance to water vapor or an organic material for the OLED process. In an embodiment, the organic layer 110 includes an organic material with a molecular weight (MW) of about 120 to 1500, such as pentacene or tetracene, for example. In another embodiment, the organic layer 110 includes a polymer, for example. The method of forming the organic layer 110 includes performing a deposition or sublimation process, for example. The thickness of the organic layer 110 is between about 1 nm and 500 nm.

Figure 1B:
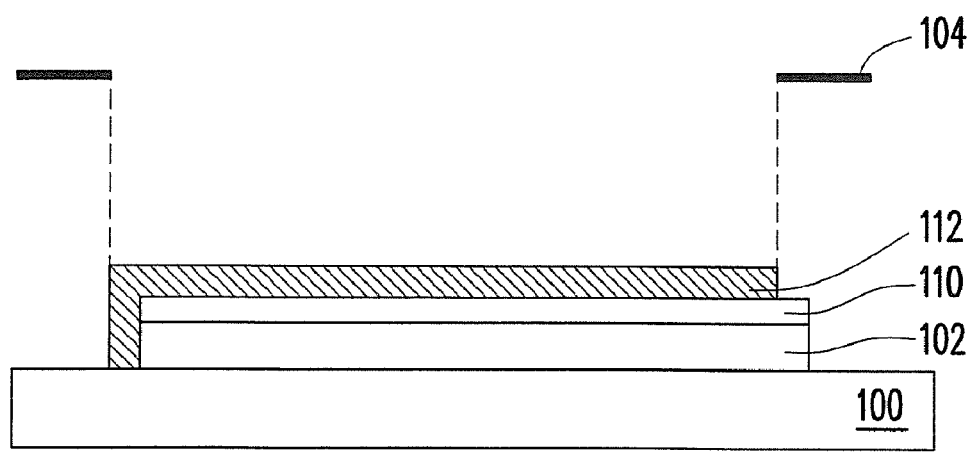

Referring to FIG. 1B, the shadow mask 104 is shifted and a metal layer 112 is formed on the substrate 100 by using the shadow mask 104 as a mask. In an embodiment, the shadow mask 104 is shifted toward the left, so that the formed metal layer 112 covers a sidewall of the OLED device 102. For example, the shadow mask 104 is shifted toward the left by about 1-500 μm relative to the central position of the OLED device 102. The material of the metal layer 112 is selected from the group consisting of Al, Ti, Cu, Au, Ag, Mg, Ni, Cr and alloys thereof. The thickness of the metal layer 112 is between about 1 and 500 nm.

Figure 1C:
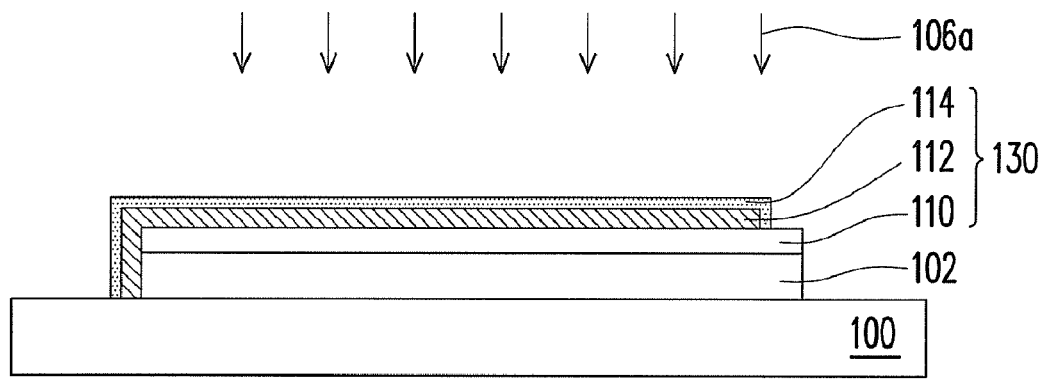

Referring to FIG. 1C, an oxidation treatment 106a is performed to oxidize a portion of the metal layer 112, so as to form a metal oxide layer 114. During the step of performing the oxidation treatment 106a, the substrate 100 is transferred to a process chamber under vacuum, and at least one UV ozone process or at least one plasma process is performed to the substrate 100, so as to enhance the capability of the film packaging. In an embodiment, during the step of performing the UV ozone process, the gas source is selected from the group consisting of ozone, oxygen and nitrogen, each process time is less than or equal to about 20 minutes, and the temperature of the substrate 100 being processed is less than or equal to about 65° C. In another embodiment, during the step of performing the plasma process, the gas source is selected from the group consisting of oxygen, nitrogen and helium, the electric power is less than or equal to about 200 W, each process time is less than or equal to about 5 minutes, and the temperature of the substrate 100 being processed is less than or equal to about 70° C. Further, during the step of performing the oxidation treatment 106a, a shadow mask can be used to protect the sensitive area, or a fully treatment can be done without using a shadow mask.

In FIG. 1C, the organic layer 110, the metal layer 112 and the metal oxide layer 114 form a protection layer 130 with a lateral protection in the package structure of the OLED device 102. The dense metal oxide layer 114 is formed on the surface of the metal layer 112 by performing an oxidation treatment to the metal layer 112. Accordingly, the inorganic structure including the metal layer 112 and the metal oxide layer 114 on the sidewall of the OLED 102 device provides excellent resistance to water vapor and oxygen, and thus the lifetime of the device is increased. In addition, the metal layer 112 has better ductility and is not easily cracked. The elasticity of the organic layer 110 can help release the stress from the metal layer 112. Therefore, the protection layer 130 can be effectively applied to the flexible packaging technology.

Figure 1D:
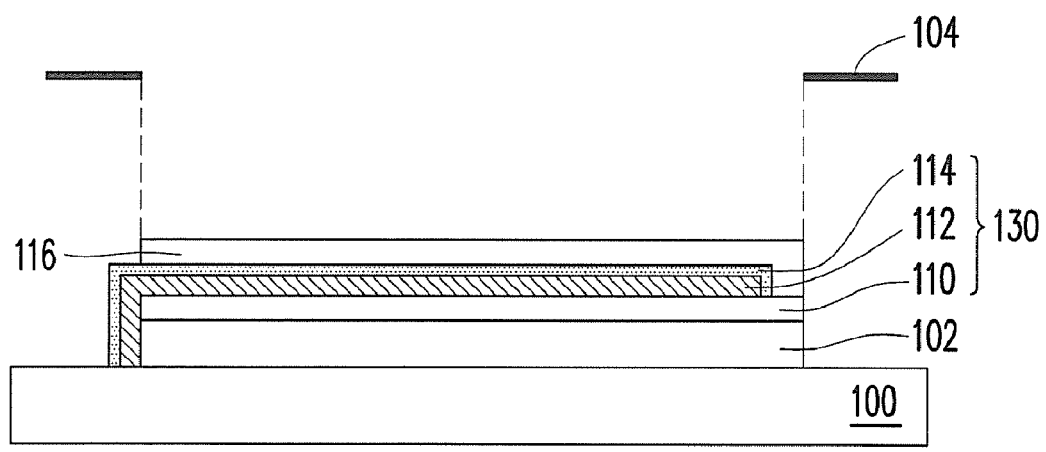

The steps in FIGS. 1A to 1C are repeated to form another protection layer with a lateral protection on the protection layer 130, so as to cover another sidewall of the OLED device 102. Referring to FIG. 1D, the shadow mask 104 is shifted back to the central region of the OLED device 102, and an organic layer 116 is formed on the substrate 100 by using the shadow mask 104 as a mask. For example, the organic layer 116 is formed on the metal oxide layer 114 and the organic layer 110 corresponding to the OLED device 102.

Figure 1E:
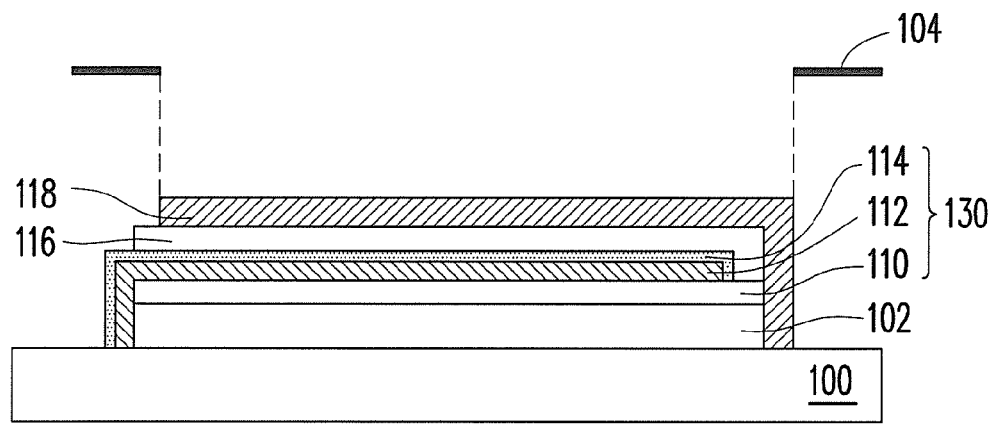

Referring to FIG. 1E, the shadow mask 104 is shifted toward the right, and a metal layer 118 is formed on the substrate 100 by using the shadow mask 104 as a mask. For example, the metal layer 112 covers one sidewall of the OLED device 102, and the metal layer 118 covers the opposite sidewall of the OLED device 102. In other words, the metal layers 112 and 118 respectively cover the different sidewalls of the OLED device 102, so as to protect the different sidewalls of the OLED device 102. The shadow mask 104 is shifted toward the right by about 1-500 μm relative to the central position of the OLED device 102.

Figure 1F:
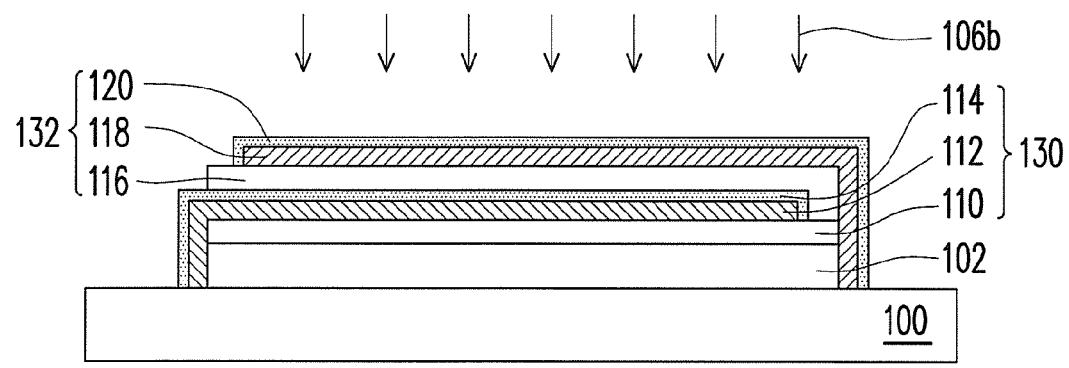

Referring to FIG. 1F, an oxidation treatment 106b is performed to oxidize a portion of the metal layer 118, so as to form a dense metal oxide layer 120. The organic layer 116, the metal layer 118 and the metal oxide layer 120 form another protection layer 132 with a lateral protection in the package structure of the OLED device 102.

Thereafter, the shadow mask 104 can be further shifted along the direction perpendicular to the figure plane and the above-mentioned steps are repeated, so as to form protection layers to cover the peripheral sidewall of the OLED device 102. The inorganic structure including the metal layer and the metal oxide layer is formed on each sidewall of the OLED device 102, so as to isolate the OLED device 102 from the external environment. Therefore, the protection of the OLED device is easily achieved by using the simple film packaging technology. Further, in the first embodiment, the metal layers are formed to cover the periphery sidewall of the device by shifting the position of the shadow mask at least 4 times. The organic layers and the metal layers are formed by using the same shadow mask, so as to simplify the manufacturing process and lower the production cost.

Figure 2A:
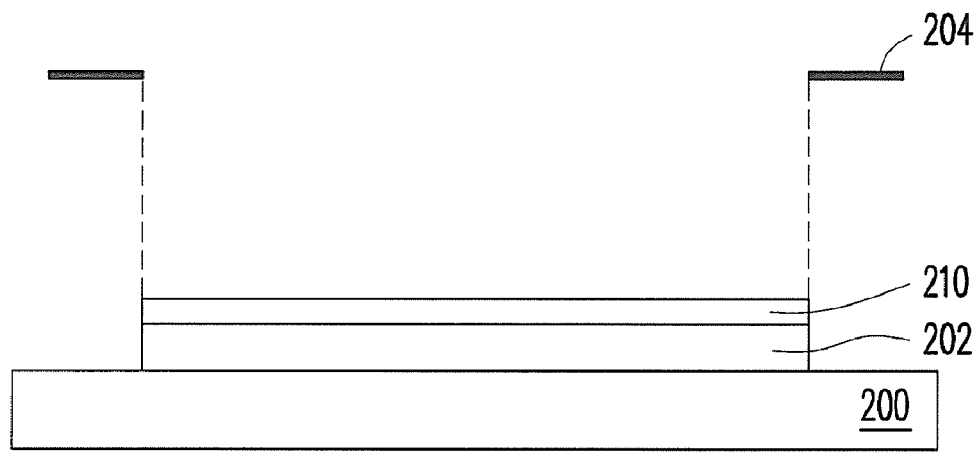
FIGS. 2A to 2F schematically illustrate, in a cross-sectional view, a package flow of an organic OLED according to a second embodiment of the present invention.
Figure 2B:
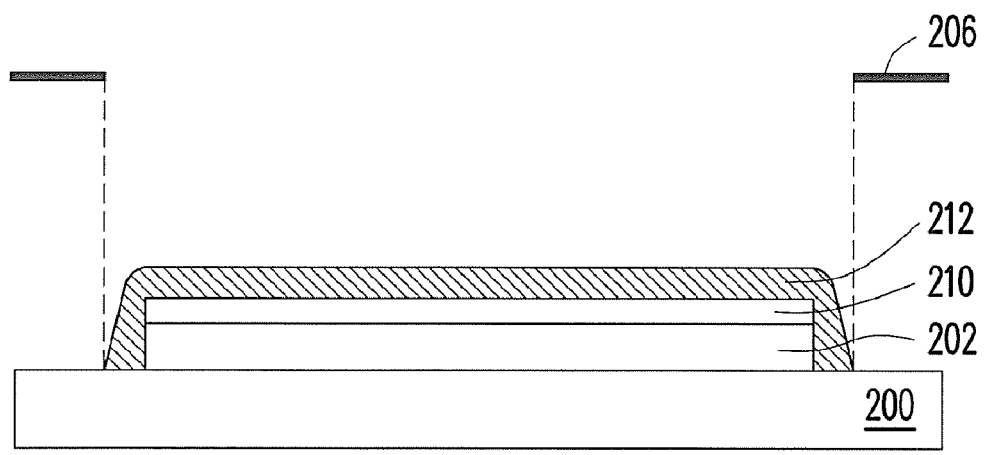
Figure 2C:
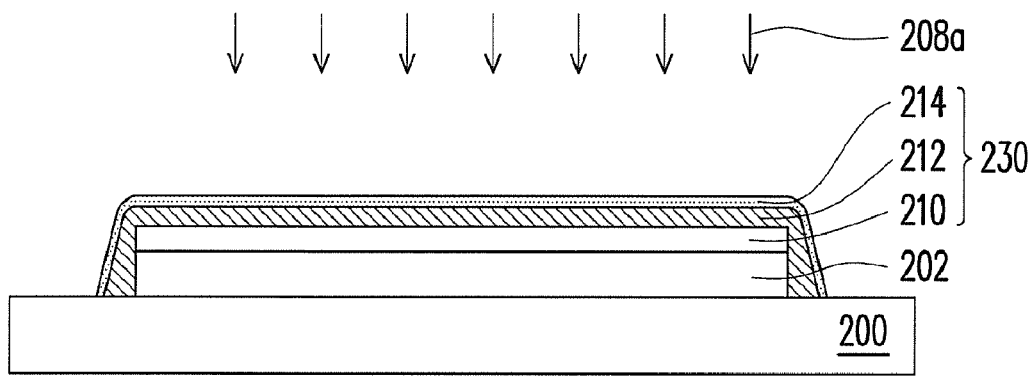

FIGS. 2A to 2C schematically illustrate, in a cross-sectional view, a package flow of an OLED device according to a second embodiment of the present invention.

Referring to FIG. 2A, a substrate 200 is provided. The substrate 200 has an OLED device 202 formed thereon. The substrate 200 may be a flexible substrate or a hard substrate. The flexible substrate is a plastic substrate, and the material thereof includes PES, PET or PI, for example. The hard substrate is a glass substrate, for example. The OLED device 202 can be fabricated with the known technology, and the layer arrangements and forming methods thereof are well-known to those of ordinary skill in the art, and thus the detailed are not iterated. Thereafter, an organic layer 210 is formed on the substrate 200 by using a shadow mask 204 as a mask. In an embodiment, the organic layer 210 is formed on the OLED device 202 corresponding to the OLED device 202. The shadow mask 204 is a fully-open metal shadow mask, and the exposed area of the shadow mask 204 is substantially the same as the area of the OLED device 202. The organic layer 210 includes an organic material with better resistance to water vapor or an organic material for the OLED process. In an embodiment, the organic layer 210 includes an organic material with a molecular weight (MW) of about 120 to 1500, such as pentacene or tetracene, for example. In another embodiment, the organic layer 210 includes a polymer, for example. The method of forming the organic layer 210 includes performing a deposition or sublimation process, for example. The thickness of the organic layer 210 is between about 1 nm and 500 nm.

Referring to FIG. 2B, a metal layer 212 is formed on the substrate 200 by using a shadow mask 206 as a mask. The metal layer 212 covers the organic layer 210 and the peripheral sidewall of the OLED device 202 entirely. In an embodiment, the exposed area of the shadow mask 206 is greater than that of the shadow mask 204. The shadow mask 206 is a fully-open metal shadow mask, and the exposed area of the shadow mask 206 is greater than the area of the OLED device 202. The material of the metal layer 212 is selected from the group consisting of Al, Ti, Cu, Au, Ag, Mg, Ni, Cr and alloys thereof. The thickness of the metal layer 212 is between about 1 and 500 nm.

Referring to FIG. 2C, an oxidation treatment 208a is performed to oxidize a portion of the metal layer 212, so as to form a metal oxide layer 214. During the step of performing the oxidation treatment 208a, the substrate 200 is transferred to a process chamber under vacuum, and at least one UV ozone process or at least one plasma process is performed to the substrate 200, so as to enhance the capability of the film packaging. In an embodiment, during the step of performing the UV ozone process, the gas source is selected from the group consisting of ozone, oxygen and nitrogen, each process time is less than or equal to about 20 minutes, and the temperature of the substrate 200 being processed is less than or equal to about 65° C. In another embodiment, during the step of performing the plasma process, the gas source is selected from the group consisting of oxygen, nitrogen and helium, the electric power is less than or equal to about 200 W, each process time is less than or equal to about 5 minutes, and the temperature of the substrate 200 being processed is less than or equal to about 70° C. Further, during the step of performing the oxidation treatment 208a, a shadow mask can be used to protect the sensitive area, or a fully treatment can be done without using a shadow mask.

In FIG. 2C, the organic layer 210, the metal layer 212 and the metal oxide layer 214 form a protection layer 230 with a lateral protection in the package structure of the OLED device 202. The metal layer 212 covers the peripheral sidewall of the OLED device 202 entirely, and the dense metal oxide layer 214 is formed on the surface of the metal layer 212 by performing an oxidation treatment to the metal layer 212. Accordingly, the inorganic structure including the metal layer 212 and the metal oxide layer 214 on the periphery sidewall of the OLED device 202 provides excellent resistance to water vapor and oxygen and thus better side leakage-proof property. In addition, the metal layer 212 has better ductility and is not easily cracked. The elasticity of the organic layer 210 can help release the stress from the metal layer 212. Therefore, the protection layer 230 can be effectively applied to the flexible packaging technology.

Figure 2D:
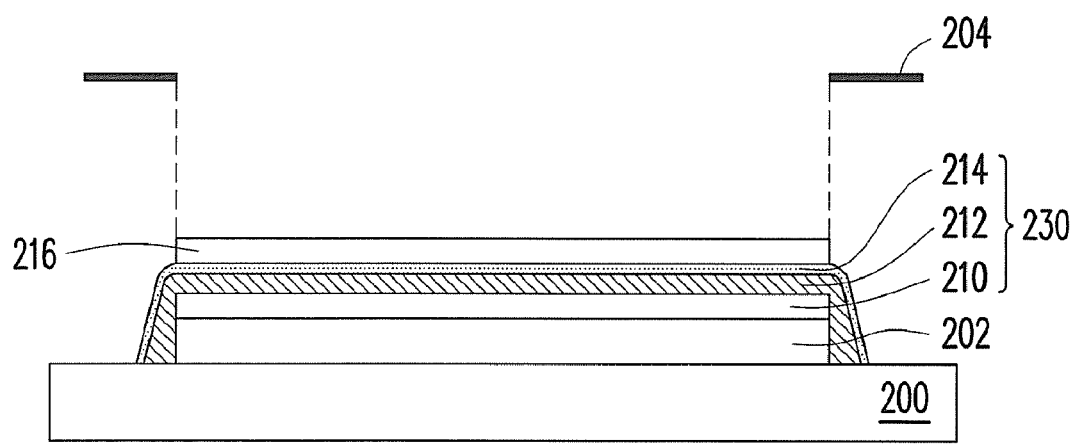

The steps in FIGS. 2A to 2C are repeated to form another protection layer on the substrate 200. Referring to FIG. 2D, an organic layer 216 is formed on the substrate 200 by using the shadow mask 204 as a mask. For example, the organic layer 216 is formed on the metal oxide layer 214 corresponding to the OLED device.

Figure 2E:
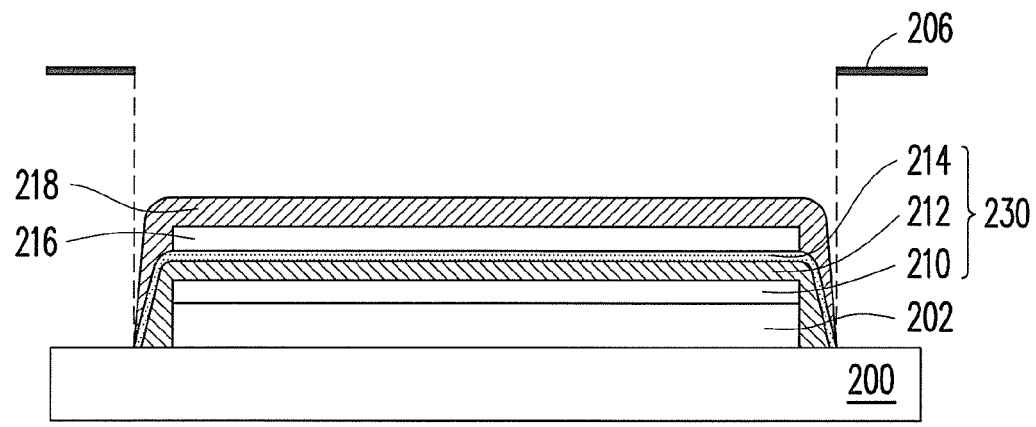

Referring to FIG. 2E, a metal layer 218 is formed on the substrate 200 by using the shadow mask 206 with larger exposed area as a mask. The metal layer 218 covers the organic layer 216 and the metal oxide layer 214 on the sidewall of the OLED device 202 entirely.

Figure 2F:
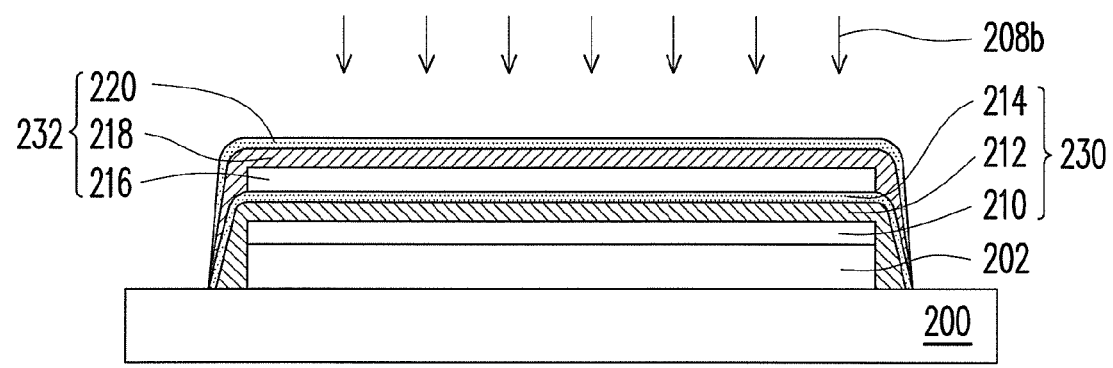

Referring to FIG. 2F, an oxidation treatment 208b is performed to oxidize a portion of the metal layer 218, so as to form a dense metal oxide layer 220 on the surface of the metal layer 218. The organic layer 216, the metal layer 218 and the metal oxide layer 220 form a protection layer 232 with a lateral protection.

As shown in FIG. 2F, the metal layer 212, the metal oxide layer 214, the metal layer 218 and the metal oxide layer 220 are sequentially stacked on the sidewall of the OLED device 202, so that the stacked inorganic structure on the sidewall can enhance the side sealing of the OLED device 202. In an embodiment, the above-mentioned steps can be repeated to form a plurality of protection layers on the OLED device 202 upon the requirement, so as to enhance the resistance to water vapor and oxygen. Further, in the second embodiment, the metal layer is formed to cover the peripheral sidewall of the OLED device 202 entirely by using the shadow mask with larger exposed area. Accordingly, the capability of the side sealing can be enhanced without difficulty.

Figure 3A:
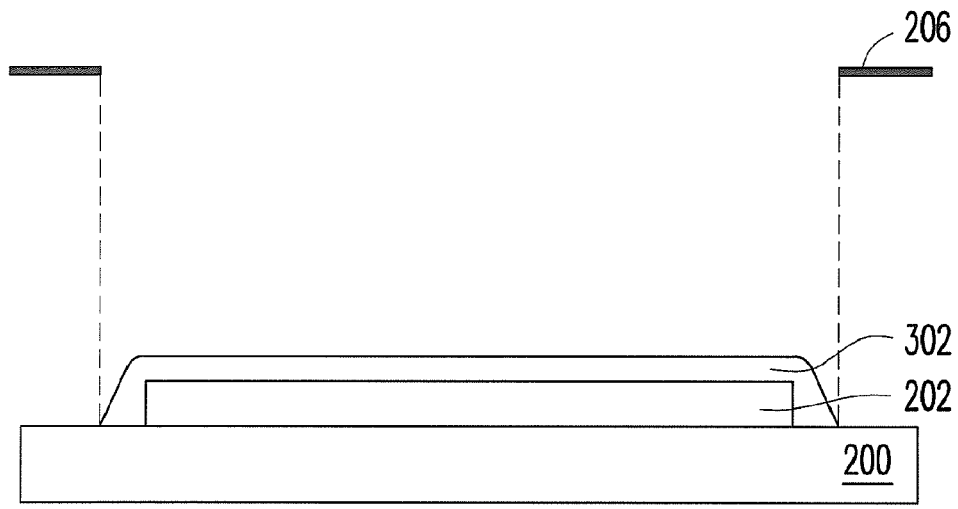
FIGS. 3A to 3C schematically illustrate, in a cross-sectional view, a package flow of an organic OLED according to a third embodiment of the present invention.
Figure 3B:
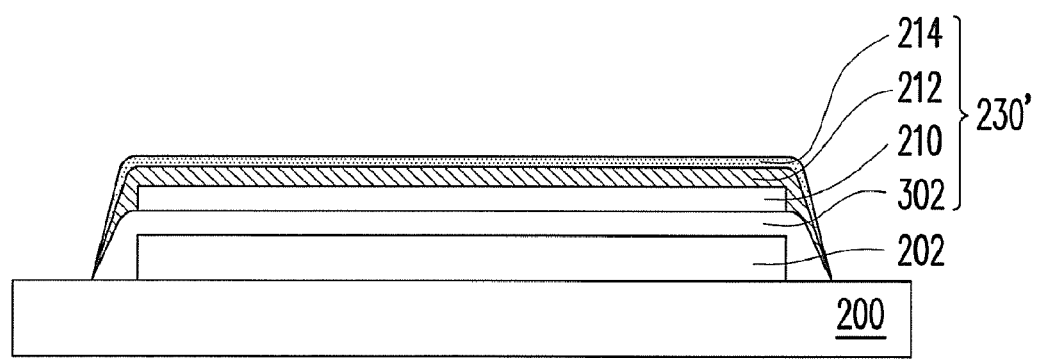
Figure 3C:
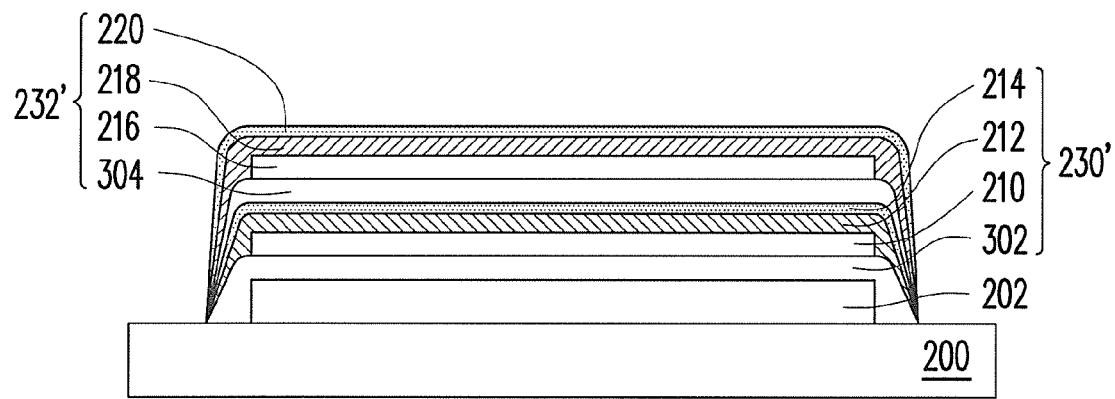

FIGS. 3A to 3C schematically illustrate, in a cross-sectional view, a package flow of an OLED according to a third embodiment of the present invention. It is noted that like components use like reference numerals in FIGS. 2A to 3C, and thus the details are not iterated.

The packaging method of the third embodiment is similar to that of the second embodiment, and the difference between them is described in the following. In the third embodiment, an inorganic layer is formed on the substrate before the step of forming the organic layer. That is, the protection layer includes an inorganic layer, an organic layer, a metal layer and a metal oxide layer.

Referring to FIG. 3A, a substrate 200 is provided. The substrate 200 has an OLED device 202 formed thereon. Thereafter, an inorganic layer 302 is formed on the substrate 200 by using a shadow mask with larger exposed area than the area of the OLED device 202 (e.g. shadow mask 206) as a mask. That is, the OLED device 202 and the peripheral sidewall thereof are covered by the inorganic layer 302 entirely. The inorganic layer 302 may be an oxide layer or a nitride layer. The oxide layer includes $SiO_x$, indium tin oxide (ITO), indium zinc oxide (IZO) or $AlO_x$, for example. The nitride layer includes $SiN_x$ or $AlN_x$, for example. The thickness of the inorganic layer 302 is between about 1 nm to 500 nm, for example.

Referring to FIG. 3B, an organic layer 210 is formed on the substrate 200 by using a shadow mask with smaller exposed area as a mask. The organic layer 210 is formed on the inorganic layer 302 corresponding to the OLED device 202. That is, the organic layer 210 is not formed on the sidewall of the OLED device 202. Thereafter, a metal layer 212 is formed on the organic layer 210 by using a shadow mask with greater exposed area as a mask. For example, the metal layer 202 covers the organic layer 210 and the inorganic layer 302 on the sidewall of the OLED device 202. Afterwards, an oxidation treatment is performed to oxidize the exposed portion of the metal layer 212, so as to form a metal oxide layer 214.

The inorganic layer 302, the organic layer 210, the metal layer 212 and the metal oxide layer 214 form a protection layer 230' with a lateral protection in the package structure of the OLED device 202. The inorganic layer 302, the metal layer 212 and the metal oxide layer 214 are sequentially stacked on the sidewall of the OLED device 202, so that the stacked inorganic structure on the sidewall provides better side sealing and thus better side leakage-proof property.

Referring to FIG. 3C, the above-mentioned steps are repeated. An inorganic layer 304, a organic layer 216, a metal layer 218 and a metal oxide layer 220 are sequentially formed on the substrate 200, so as to form another protection layer 232'. In an embodiment, the number of the protection layers can be adjusted to enhance the resistance to water vapor and oxygen upon the requirement, and is not limited by the present invention.

It is noted that the above-mentioned embodiments in which an oxidation treatment is performed to the surface of each metal layer so as to form a metal oxide layer are provided for illustration purposes, and are not construed as limiting the present invention. In another embodiment, an oxidation treatment can be performed to the outmost metal layer or some of the metal layers, and the process can be adjusted by those of ordinary skill in the art upon the requirement.

The structure of the OLED apparatus of the present invention is illustrated, for example, by the structures respectively shown in FIGS. 1F, 2F and 3C

Referring to FIG. 1F, the OLED apparatus includes a substrate 100, an OLED device 102 and protection layers 130 and 132. The OLED device 102 is disposed on the substrate 100. The protection layers 130 and 132 are disposed on the substrate 100. Each of the protection layers 130 and 132 may be a structure with a lateral protection, so as to cover the different sidewalls of the OLED device 102.

The protection layer 130 includes an organic layer 110, a metal layer 112 and a metal oxide layer 114. The organic layer 110 is formed on the OLED device 102 corresponding to the OLED device 102. The metal layer 112 is disposed on the organic layer 110. In an embodiment, the horizontal coverage area of the organic layer 110 is substantially the same as that of the metal layer 112. The metal layer 112 and the OLED device 102 are not aligned and the metal layer 112 covers a sidewall of the OLED device 102. The metal oxide layer 114 is disposed on the surface of the metal layer 112, so as to form a dense outer layer to prevent water vapor and oxygen from entering. In an embodiment, the metal oxide layer 114 is an oxide layer formed by performing an oxidation treatment to the metal layer 112, wherein the oxidation treatment includes a UV ozone process or a plasma process, for example.

The protection layer 132 is disposed on the protection layer 130. The protection layer 132 includes an organic layer 116, a metal layer 118 and a metal oxide layer 120. The organic layer 116 is formed on the metal oxide layer 114 and the organic layer 110 corresponding to the OLED device 102. In an embodiment, the horizontal coverage area of the organic layer 116 is substantially the same as that of the metal layer 118. The metal layer 118 and the OLED device 102 are not aligned. The metal layer 112 covers one sidewall of the OLED device 102 and the metal layer 118 covers the opposite sidewall of the OLED device 102. In other words, the metal layers 112 and 118 respectively cover the different sidewalls of the OLED device 102. The metal oxide layer 120 is disposed on the surface on the metal layer 118, so as to prevent water vapor and oxygen from entering.

Referring to FIG. 2F, the OLED apparatus includes a substrate 200, an OLED device 202 and protection layers 230 and 232. The OLED device 202 is disposed on the substrate 200. The protection layers 230 and 232 are disposed on the substrate 100. Each of the protection layers 130 and 132 may be a structure with a fully protection, so as to cover the periphery sidewall of the OLED device 202 entirely.

The protection layer 230 includes an organic layer 210, a metal layer 212 and a metal oxide layer 214. The organic layer 210 is formed on the OLED device 202 corresponding to the OLED device 202. The metal layer 212 is disposed on the organic layer 210. In an embodiment, the horizontal coverage area of the metal layer 112 is greater than that of the organic layer 110. For example, the metal layer 112 covers the peripheral sidewall of the OLED device 102 entirely. The metal oxide layer 214 is disposed on the surface of the metal layer 212, so as to form a dense outer layer to prevent water vapor and oxygen from entering. In an embodiment, the metal oxide layer 214 is an oxide layer formed by performing an oxidation treatment to the metal layer 212, wherein the oxidation treatment includes a UV ozone process or a plasma process, for example.

The protection layer 232 is disposed on the protection layer 230. The protection layer 232 includes an organic layer 216, a metal layer 218 and a metal oxide layer 220. The organic layer 216 is formed on the metal oxide layer 214 corresponding to the OLED device 202. In an embodiment, the horizontal coverage area of the metal layer 218 is greater than that of the organic layer 216. For example, the metal layer 218 covers the peripheral sidewall of the OLED device 202 entirely. The metal oxide layer 220 is disposed on the surface on the metal layer 218, so as to prevent water vapor and oxygen from entering.

Referring to FIG. 3C, the OLED apparatus in FIG. 3C is similar to that in FIG. 2F, and the difference between them is that the protection layers 230' and 232' of the OLED apparatus in FIG. 3C further includes inorganic layers 302 and 304 respectively. Each of the inorganic layers 302 and 304 can be an oxide layer or a nitride layer.

The inorganic layer 302 is disposed between the substrate 200 and the organic layer 210. In an embodiment, the horizontal coverage area of the inorganic layer 302 is greater than that of the organic layer 210. For example, the OLED device 202 and the peripheral sidewall thereof are covered by the inorganic layer 302 entirely. Accordingly, the metal layer 212 is disposed on the organic layer 210 and the inorganic layer 302 on the sidewall of the OLED device 202.

The inorganic layer 304 is disposed between the metal oxide layer 214 and the organic layer 216. In an embodiment, the horizontal coverage area of the inorganic layer 304 is greater than that of the organic layer 216. For example, the inorganic layer 304 covers the metal oxide layer 214 entirely. Accordingly, the metal layer 218 covers the organic layer 216 and the inorganic layer 304 on the sidewall of the OLED device 202.

To prove that the side sealing of the device is enhanced by using the package structure of the OLED of the present invention, several examples are provided below for illustrating the properties of the OLED package structure. In the following examples, the effect of a metal layer and an UV ozone process on the water vapor transmission rate (WVTR) of the package structure is provided for illustration purposes, and is not construed as limiting the present invention.

Example 1

Figure 4A:
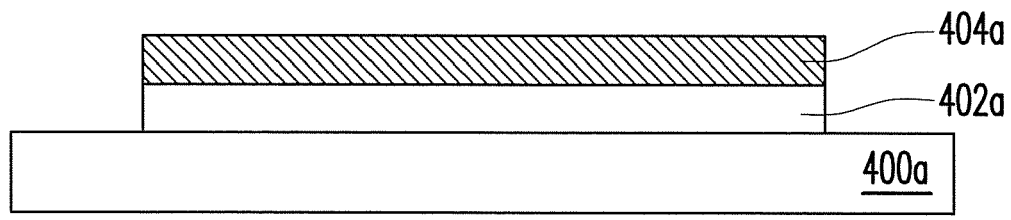
FIG. 4A schematically illustrates a cross-sectional view of a stacked structure according to Example 1 of the present invention.

FIG. 4A schematically illustrates a cross-sectional view of a stacked structure according to Example 1 of the present invention.

Referring to FIG. 4A, a polyimide (PI) substrate 400a was provided, and an organic layer 402a and a metal layer 404a were sequentially formed on the substrate 400a. The material of the organic layer 402a was pentacene, and the thickness of the same was about 150 nm. The material of the metal layer 404a was aluminum and the thickness of the same was about 150 nm. Thereafter, the WVTR of the stacked structure was measured by MOCON Permatran W3/60 Water Vapor Permeability and the temperature of the substrate 400a was measured at the same time.

Example 2

Figure 4B:
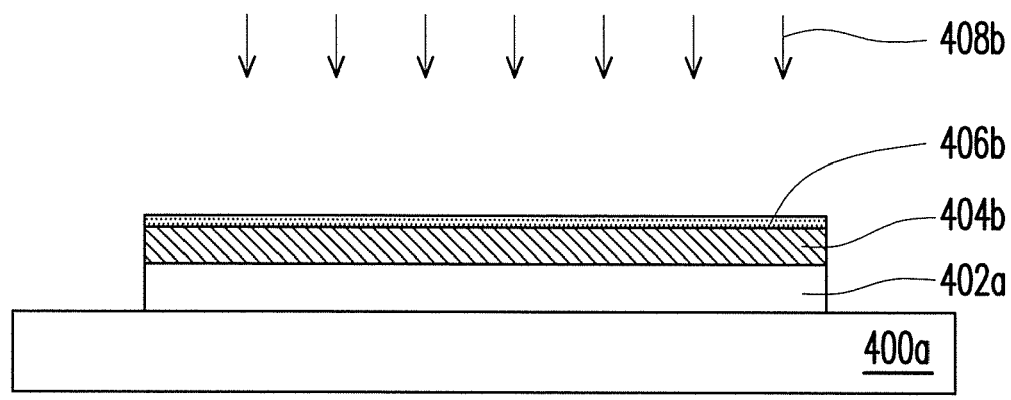
FIG. 4B schematically illustrates a cross-sectional view of a stacked structure according to Example 2 of the present invention.

FIG. 4B schematically illustrates a cross-sectional view of a stacked structure according to Example 2 of the present invention.

Referring to FIG. 4B, a UV ozone process 408b was performed to a stacked structure obtained in Example 1, so as to form a metal oxide layer 406a on the surface of the metal layer 404b. During the step of performing the UV ozone process 408b, the gas source was selected from the group consisting of ozone, oxygen and nitrogen, and the process time was about 5 minutes. Thereafter, the testing of the stacked structure in Example 2 was done by following the measurement step described in Example 1.

Example 3

Figure 4C:
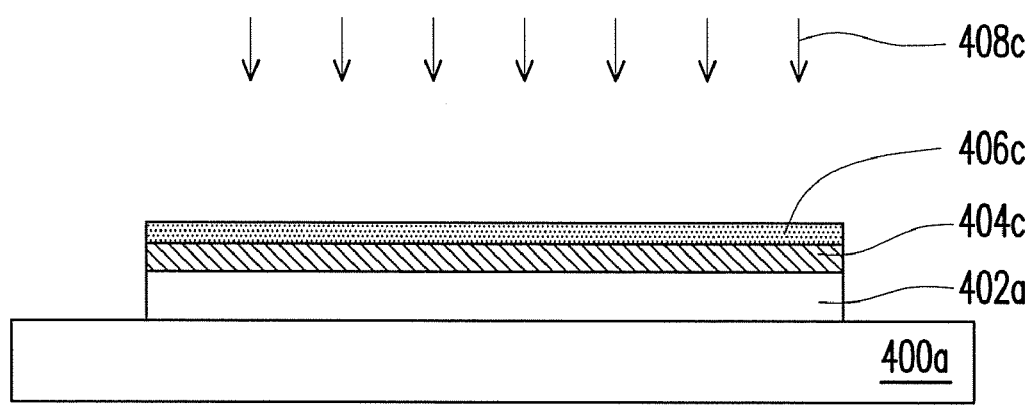
FIG. 4C schematically illustrates a cross-sectional view of a stacked structure according to Example 3 of the present invention.

FIG. 4C schematically illustrates a cross-sectional view of a stacked structure according to Example 3 of the present invention.

Referring to FIG. 4C, a UV ozone process 408c was performed to a stacked structure obtained in Example 1, so as to form a metal oxide layer 406c on the surface of the metal layer 404c. During the step of performing the UV ozone process 408c, the gas source was selected from the group consisting of ozone, oxygen and nitrogen, and the process time was about 15 minutes. Thereafter, the testing of the stacked structure in Example 3 was done by following the measurement step described in Example 1.

Comparative Example

A polyimide substrate without any layer formed thereon was provided. The testing of the polyimide substrate of Comparative Example was done by following the measurement step described in Example 1.

Table 1 shows the WVTR and the substrate temperature of each of Examples 1-3 and Comparative Example.

TABLE 1

|  | Comparative Example | Example 1 | Example 2 | Example 3 |
|---|---|---|---|---|
| WVTR (g/m$^2$/day) | 10.15 | 1.981 | 0.876 | 0.681 |
| Substrate Temp. (° C.) | Room temperature | <50 | <65 | <65 |

As shown in Table 1, the WVTR of each of Examples 1-3 is obviously lower than that of Comparative Example. The WVTR of Example 1 is greater than that of Example 2, and the WVTR of Example 2 is greater than that of Example 3. In other words, the WVTR can be reduced with the protection structure only including an organic layer and a metal layer (Example 1), and the WVTR can be further reduced by adding an UV ozone process to oxidize the surface of the metal layer (Example 2 and 3). The VWTR is reduced as the process time of the UV ozone process is increased. In addition, the substrate temperature is maintained at low temperature no matter when the organic layer or the metal layer is formed, or the UV ozone process is performed. The low substrate temperature is beneficial to prevent the OLED device from being damaged.

In summary, the packaging method of the OLED of the present invention includes sequentially stacking an organic layer and a metal layer on the OLED device, and then performing an oxidation treatment to form a dense metal oxide layer on the surface of the metal layer, so as to enhance the capability of the film packaging. Accordingly, the OLED device is effectively isolated from the external environment, and thus the lifetime and performance of the device are accordingly increased. Further, the method in accordance with the present invention utilizes the function of an evaporation machine itself and a simple method to complete the film packaging. With the advantages of short process time and low substrate temperature, the method of the present invention can simplify the packaging process and reduce the inner damage of the OLED caused by the conventional packaging process.

In addition, the OLED apparatus of the present invention has a stacked structure including an organic material and an inorganic material as a protection layer of the OLED device. Moreover, the side sealing of the device is enhanced by the stacked inorganic structure on the sidewall of the OLED device. Therefore, the effect of water vapor and oxygen on the OLED device is greatly reduced and the lifetime of the device is increased.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A packaging method of an organic light emitting diode (OLED), comprising:
    providing a substrate, the substrate having the OLED device formed thereon; and
    forming at least one protection layer on the substrate, so as to cover a peripheral sidewall of the OLED device entirely; wherein the step of forming the protection layer comprises:
        forming an organic layer on the substrate, wherein the organic layer is not covering a sidewall of the OLED device;
        forming a metal layer on the organic layer, so as to at least covers a sidewall of the OLED device and is in direct contact with the sidewall of the OLED device; and
        performing an oxidation treatment, so as to oxidize a portion of the metal layer to form a metal oxide layer, wherein the metal layer is located between the organic layer and the metal oxide layer, and a sidewall and a top surface of the organic layer are covered by the metal layer and the metal oxide layer.

2. The packaging method of claim 1, wherein the step of performing the oxidation treatment comprises performing at least one UV ozone process.

3. The packaging method of claim 2, wherein a gas source used in the UV ozone process is selected from the group consisting of ozone, oxygen and nitrogen.

4. The packaging method of claim 3, wherein a time of performing each UV ozone process is less than or equal to 20 minutes.

5. The packaging method of claim 3, wherein a temperature of the substrate is less than or equal to 65° C. during the step of performing the UV ozone process.

6. The packaging method of claim 2, wherein the step of performing the oxidation treatment comprises performing at least one plasma process.

7. The packaging method of claim 6, a gas source used in the plasma process is selected from the group consisting of oxygen, nitrogen and helium.

8. The packaging method of claim 6, wherein an electric power used in the plasma process is less than or equal to 200 W.

9. The packaging method of claim 6, wherein a time of performing each plasma process is less than or equal to 5 minutes.

10. The packaging method of claim 6, wherein a temperature of the substrate is less than or equal to 70° C. during the step of performing the plasma process.

11. The packaging method of claim 1, wherein the step of performing the protection layer comprises:
    forming the organic layer on the substrate by using a shadow mask as a mask; and
    shifting the shadow mask and forming the metal layer on the organic layer by using the shadow mask as a mask, wherein the metal layer covers the sidewall of the OLED device.

12. The packaging method of claim 11, further comprising performing a plurality of the steps of forming the protection layer, wherein the shadow mask is shifted toward different directions, so as to cover the peripheral sidewall of the OLED device entirely.

13. The packaging method of claim 1, wherein the step of forming the protection layer comprises:
    forming the organic layer on the substrate by using a first shadow mask as a mask; and
    forming the metal layer on the organic layer by using a second shadow mask as a mask, wherein the metal layer covers the peripheral sidewall of the OLED device entirely, and an exposed area of the second shadow mask is greater than an exposed area of the first shadow mask.

14. The packaging method of claim 13, wherein the step of forming the protection layer further comprises forming an inorganic layer on the substrate before the step of forming the organic layer.

15. The packaging method of claim 14, wherein the inorganic layer is an oxide layer or a nitride layer.

16. The packaging method of claim 15, wherein the oxide layer comprises $SiO_x$, ITO, IZO or $AlO_x$.

17. The packaging method of claim 15, wherein the nitride layer comprises $SiN_x$ or $AlN_x$.

18. The packaging method of claim 14, wherein a thickness of the inorganic layer is between 1 nm and 500 nm.

19. The packaging method of claim 1, wherein the organic layer comprises an organic material with a molecular weight of about 120 to 1500.

20. The packaging method of claim 1, wherein the organic layer is formed by performing a deposition or sublimation process.

21. The packaging method of claim 1, wherein a thickness of the organic layer is between 1 nm and 500 nm.

22. The packaging method of claim 1, wherein a material of the metal layer is selected from the group consisting of Al, Ti, Cu, Au, Ag, Mg, Ni, Cr and alloys thereof.

23. The packaging method of claim 1, wherein a thickness of the metal layer is between 1 nm and 500 nm.

24. The packaging method of claim 1, wherein the substrate is a flexible substrate or a hard substrate.

25. An organic light emitting diode (OLED) apparatus, comprising:
    a substrate;
    an OLED device, disposed on the substrate; and
    at least one protection layer, disposed on the substrate, covering a peripheral sidewall of the OLED device entirely and comprising:
        an organic layer, disposed on the substrate, wherein the organic layer is not covering a sidewall of the OLED device;
        a metal layer, disposed on the organic layer, wherein the metal layer at least covers a sidewall of the OLED device and is in direct contact with the sidewall of the OLED device; and
        a metal oxide layer, disposed on a surface of the metal layer, wherein the metal layer is located between the organic layer and the metal oxide layer, and a sidewall and a top surface of the organic layer are covered by the metal layer and the metal oxide layer.

26. The OLED apparatus of claim 25, wherein the metal oxide layer is an oxide layer formed by performing an oxidation treatment to the metal layer.

27. The OLED apparatus of claim 26, wherein the oxidation treatment comprises a UV ozone process or a plasma process.

28. The OLED apparatus of claim 25, wherein the organic layer is disposed on the substrate corresponding to the OLED device.

29. The OLED apparatus of claim 25, wherein a horizontal coverage area of the organic layer is substantially the same as a horizontal coverage area of the metal layer.

30. The OLED apparatus of claim 29, wherein the metal layer and the OLED device are not aligned and the metal layer covers the sidewall of the OLED device.

31. The OLED apparatus of claim 25, wherein a horizontal coverage area of the metal layer is greater than a horizontal coverage area of the organic layer.

32. The OLED apparatus of claim 31, wherein the metal layer covers the peripheral sidewall of the OLED device entirely.

33. The OLED apparatus of claim 25, wherein the protection layer further comprises an inorganic layer disposed between the substrate and the organic layer.

34. The OLED apparatus of claim 33, wherein a horizontal coverage area of the inorganic layer is greater than a horizontal coverage area of the organic layer.

35. The OLED apparatus of claim 33, wherein the inorganic layer is an oxide layer or a nitride layer.

36. The OLED apparatus of claim 35, wherein the oxide layer comprises $SiO_x$, ITO, IZO or $AlO_x$.

37. The OLED apparatus of claim 35, wherein the nitride layer comprises $SiN_x$ or $AlN_x$.

38. The OLED apparatus of claim 33, wherein a thickness of the inorganic layer is between 1 nm and 500 nm.

39. The OLED apparatus of claim 25, wherein the organic layer comprises an organic material with a molecular weight of about 120 to 1500.

40. The OLED apparatus of claim 25, wherein a thickness of the organic layer is between 1 nm and 500 nm.

41. The OLED apparatus of claim 25, wherein a material of the metal layer is selected from the group consisting of Al, Ti, Cu, Au, Ag, Mg, Ni, Cr and alloys thereof.

42. The OLED apparatus of claim 25, wherein a thickness of the metal layer is between 1 nm and 500 nm.

43. The OLED apparatus of claim 25, wherein the substrate is a flexible substrate or a hard substrate.

44. An organic light emitting diode (OLED) apparatus, comprising:
a substrate;
an OLED device, disposed on the substrate; and
at least one protection layer, disposed on the substrate, covering a peripheral sidewall of the OLED device entirely and comprising:
an organic layer, disposed on the substrate;
a metal layer, disposed on the organic layer, wherein the metal layer at least covers a sidewall of the OLED device and is in direct contact with the sidewall of the OLED device; and
a metal oxide layer, disposed on a surface of the metal layer,
wherein the metal layer is located between the organic layer and the metal oxide layer, and a sidewall and a top surface of the organic layer are covered by the metal layer and the metal oxide layer.

45. An organic light emitting diode (OLED) apparatus, comprising:
a substrate;
an OLED device, disposed on the substrate; and
at least two stacked protection layers, stacked and disposed on the substrate, covering a peripheral sidewall of the OLED device entirely, wherein each of the stacked protection layers comprises:
an organic layer, disposed on the substrate;
a metal layer, disposed on the organic layer, wherein the metal layer at least covers a sidewall of the OLED device and is in direct contact with the sidewall of the OLED device; and
a metal oxide layer, disposed on a surface of the metal layer,
wherein the metal layer is located between the organic layer and the metal oxide layer, and a sidewall and a top surface of the organic layer are covered by the metal layer and the metal oxide layer.

* * * * *